US 11,063,140 B2

United States Patent
Pekarik et al.

(10) Patent No.: US 11,063,140 B2
(45) Date of Patent: Jul. 13, 2021

(54) COMPLEMENTARY TRANSISTOR STRUCTURES FORMED WITH THE ASSISTANCE OF DOPED-GLASS LAYERS

(71) Applicant: GLOBALFOUNDRIES U.S. Inc., Santa Clara, CA (US)

(72) Inventors: John J. Pekarik, Underhill, VT (US); Anthony K. Stamper, Williston, VT (US); Vibhor Jain, Essex Junction, VT (US); Steven M. Shank, Jericho, VT (US); John J. Ellis-Monaghan, Grand Isle, VT (US); Herbert Ho, New Windsor, NY (US); Qizhi Liu, Lexington, MA (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/784,683

(22) Filed: Feb. 7, 2020

(65) Prior Publication Data
US 2021/0098612 A1 Apr. 1, 2021

Related U.S. Application Data

(60) Provisional application No. 62/906,968, filed on Sep. 27, 2019.

(51) Int. Cl.
*H01L 29/737* (2006.01)
*H01L 29/66* (2006.01)
(Continued)

(52) U.S. Cl.
CPC ...... *H01L 29/7378* (2013.01); *H01L 27/0826* (2013.01); *H01L 29/0821* (2013.01); *H01L 29/42304* (2013.01); *H01L 29/66242* (2013.01)

(58) Field of Classification Search
CPC ............ H01L 29/7378; H01L 27/0826; H01L 29/66242; H01L 29/0821; H01L 29/42304
See application file for complete search history.

(56) References Cited

U.S. PATENT DOCUMENTS

| | | |
|---|---|---|
| 5,930,635 A | 7/1999 | Bashir et al. |
| 7,144,789 B2 | 12/2006 | El-Kareh et al. |
| (Continued) | | |

OTHER PUBLICATIONS

B. Heinemann et al., "A complementary BiCMOS technology with high speed npn and pnp SiGe:C HBTs," IEEE International Electron Devices Meeting 2003, Washington, DC, USA, 2003, pp. 5.2.1-5.2.4.

(Continued)

*Primary Examiner* — Syed I Gheyas
(74) *Attorney, Agent, or Firm* — Thompson Hine LLP; Anthony Canale (57) ABSTRACT

Structures for a heterojunction bipolar transistor and methods of forming a structure for a heterojunction bipolar transistor. A first heterojunction bipolar transistor includes a first emitter, a first collector, and a first base layer having a portion positioned between the first emitter and the first collector. A second heterojunction bipolar transistor includes a second emitter, a second collector, and a second base layer having a portion positioned between the second emitter and the second collector. The first and second base layers each comprise silicon-germanium, the first base layer includes a first germanium profile, and the second base layer includes a second germanium profile that is identical to the first germanium profile.

20 Claims, 8 Drawing Sheets

(51) Int. Cl.
    *H01L 29/08*     (2006.01)
    *H01L 29/423*     (2006.01)
    *H01L 27/082*     (2006.01)

(56) References Cited

U.S. PATENT DOCUMENTS

| | | |
|---|---|---|
| 7,846,805 B2 | 12/2010 | Zhang et al. |
| 7,855,404 B2 | 12/2010 | Heinenman et al. |
| 8,035,167 B2 | 10/2011 | Knoll et al. |
| 2009/0206335 A1* | 8/2009 | Heinemann ......... H01L 27/0826 257/51 |
| 2015/0303187 A1 | 10/2015 | Preisler et al. |

OTHER PUBLICATIONS

N. E. Lourenco et al., "On the Transient Response of a Complementary (npn $+$ pnp) SiGe HBT BiCMOS Technology," in IEEE Transactions on Nuclear Science, vol. 61, No. 6, pp. 3146-3153, Dec. 2014.

\* cited by examiner

COMPLEMENTARY TRANSISTOR STRUCTURES FORMED WITH THE ASSISTANCE OF DOPED-GLASS LAYERS

CROSS-REFERENCE TO RELATED APPLICATIONS

This application claims the benefit of U.S. Provisional Application No. 62/906,968, filed Sep. 27, 2019, which is hereby incorporated by reference herein in its entirety.

BACKGROUND

The invention relates generally to semiconductor devices and integrated circuit fabrication and, in particular, to structures for a heterojunction bipolar transistor and methods of forming a structure for a heterojunction bipolar transistor.

A bipolar junction transistor is a multi-terminal electronic device that includes an emitter, a collector, and an intrinsic base arranged between the emitter and collector. In an NPN bipolar junction transistor, the emitter and collector are composed of n-type semiconductor material, and the intrinsic base is composed of p-type semiconductor material. In a PNP bipolar junction transistor, the emitter and collector are composed of p-type semiconductor material, and the intrinsic base is composed of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Although existing structures have proven suitable for their intended purpose, improved structures for a heterojunction bipolar transistor and methods of forming a structure for a heterojunction bipolar transistor are needed.

SUMMARY

In an embodiment of the invention, a structure includes a first heterojunction bipolar transistor having a first emitter, a first collector, and a first base layer with a portion positioned between the first emitter and the first collector. The structure further includes a second heterojunction bipolar transistor having a second emitter, a second collector, and a second base layer with a portion positioned between the second emitter and the second collector. The first base layer and the second base layer each comprise silicon-germanium, the first base layer includes a first germanium profile, and the second base layer includes a second germanium profile that is identical to the first germanium profile.

In an embodiment of the invention, a method includes forming a first collector of a first heterojunction bipolar transistor and a second collector of a second heterojunction bipolar transistor in a semiconductor substrate, and forming a base layer including a first section extending over the first collector and a second section extending over the second collector. The method further includes forming a first emitter on the first section of the base layer and a second emitter on the second section of the base layer. The first section and the second section of the base layer each comprise silicon-germanium, the first section of the base layer includes a first germanium profile, and the second section of the base layer includes a second germanium profile that is identical to the first germanium profile.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
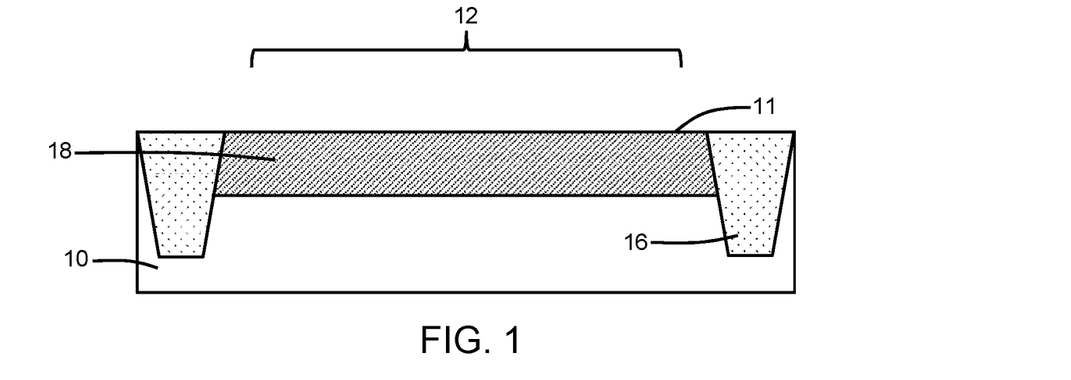
FIGS. 1 and 1A are cross-sectional views of a structure at an initial fabrication stage of a processing method in accordance with embodiments of the invention.
Figure 1A:
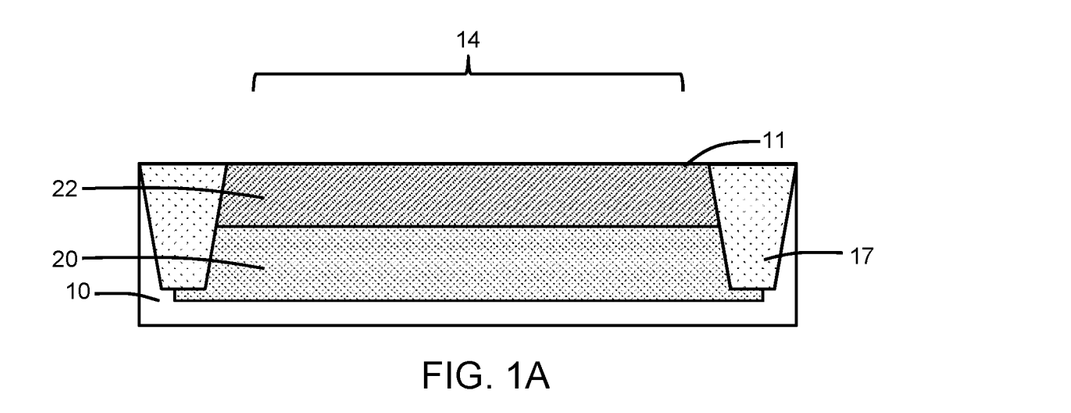

With reference to FIGS. 1, 1A and in accordance with embodiments of the invention, a semiconductor substrate 10 is provided that is composed of a monocrystalline or single-crystal semiconductor material, such as single-crystal silicon. The semiconductor substrate 10 may be a bulk wafer composed of single-crystal semiconductor material (e.g., single-crystal silicon). The semiconductor substrate 10 may include a device region 12 (FIG. 1) and a device region 14 (FIG. 1A) that are defined by shallow trench isolation regions 16, 17 located in the semiconductor substrate 10. The shallow trench isolation regions 16, 17 may be formed by patterning trenches, depositing a dielectric material, such as silicon dioxide, in the trenches, and planarizing with chemical-mechanical polishing. The shallow trench isolation regions 16 surround a portion of the semiconductor substrate 10 in the device regions 12 and the shallow trench isolation regions 17 surround a portion of the semiconductor substrate 10 in the device region 14.

A doped region 18 is formed in the device region 12 and is positioned beneath a top surface 11 of the semiconductor substrate 10. In an embodiment, the semiconductor material of the doped region 18 may be doped with an n-type dopant (e.g., phosphorus and/or arsenic) that provides n-type conductivity. In an embodiment, the semiconductor material of the doped region 18 may be doped to have an opposite conductivity type from the underlying semiconductor substrate 10. The doped region 18 may be formed by, for example, ion implantation with an implantation mask exposing the device region 12 and covering the device region 14. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped region 18. The implantation mask may be stripped after forming the doped region 18. The doped region 18 in the device region 12 may be heavily doped (e.g., a dopant concentration greater than or equal to $1\times10^{18}$ cm$^{-3}$), and may provide a sub-collector for the device structure under construction in the device region 12.

A doped region 20 is formed in the device region 14 and is positioned beneath a top surface 11 of the semiconductor substrate 10. In an embodiment, the semiconductor material of the doped region 20 may be doped with an n-type dopant (e.g., phosphorus and/or arsenic) that provides n-type conductivity. In an embodiment, the semiconductor material of the doped region 20 may be doped to have an opposite conductivity type from the underlying semiconductor substrate 10. The doped region 20 may be formed by, for example, ion implantation with an implantation mask exposing the device region 14 and covering the device region 12. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped region 20. The implantation mask may be stripped after forming the doped region 20. The doped region 20 in the device region 14 may be doped with a dopant concentration in a range of $1\times10^{15}$ cm$^{-3}$ to $1\times10^{19}$ cm$^{-3}$.

A doped region 22 is formed in the device region 14 and is positioned beneath a top surface 11 of the semiconductor substrate 10. In an embodiment, the semiconductor material of the doped region 22 may be doped with a p-type dopant (e.g., boron) that provides p-type conductivity. In an embodiment, the semiconductor material of the doped region 22 may be doped to have the same conductivity type as the semiconductor substrate 10 beneath the doped region 20. The doped region 22 may be formed by, for example, ion implantation with an implantation mask exposing the device region 14 and covering the device region 12. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped region 22. The implantation mask may be stripped after forming the doped region 22. The doped region 22 in the device region 14 may be heavily doped and may define a sub-collector for a subsequently formed heterojunction bipolar transistor.

The doped region 22 is formed in a tub defined by the doped region 20 and is doped to have an opposite conductivity type from the doped region 20. The doped region 20 extends completely across the device region 14 in order to, in conjunction with the shallow trench isolation regions 16, electrically isolate the doped region 22 from the semiconductor substrate 10. The doped region 22 may provide a sub-collector for the device structure under construction in the device region 14.

Figure 2:
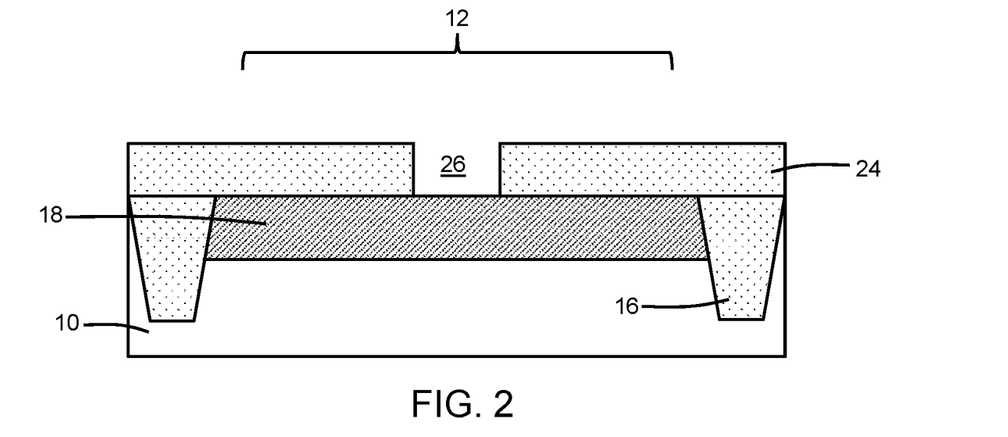
FIGS. 2 and 2A are cross-sectional views of a structure at a fabrication stage subsequent to FIGS. 1 and 1A.
Figure 2A:
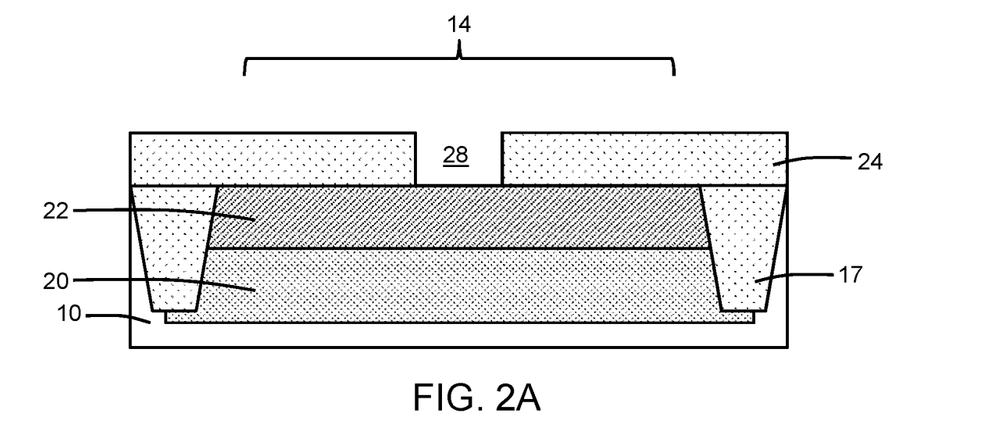

With reference to FIGS. 2, 2A in which like reference numerals refer to like features in FIGS. 1, 1A and at a subsequent fabrication stage of the processing method, a dielectric layer 24 composed of a dielectric material, such as silicon dioxide, is deposited over both device regions 12, 14 of the semiconductor substrate 10. The dielectric layer 24 is patterned with lithography and etching processes to define an opening 26 penetrating through the dielectric layer 24 in the device region 12 to the doped region 18 and an opening 28 penetrating through the dielectric layer 24 in the device region 14 to the doped region 22. The openings 26, 28 define the active collector areas of the device structures under construction.

Figure 3:
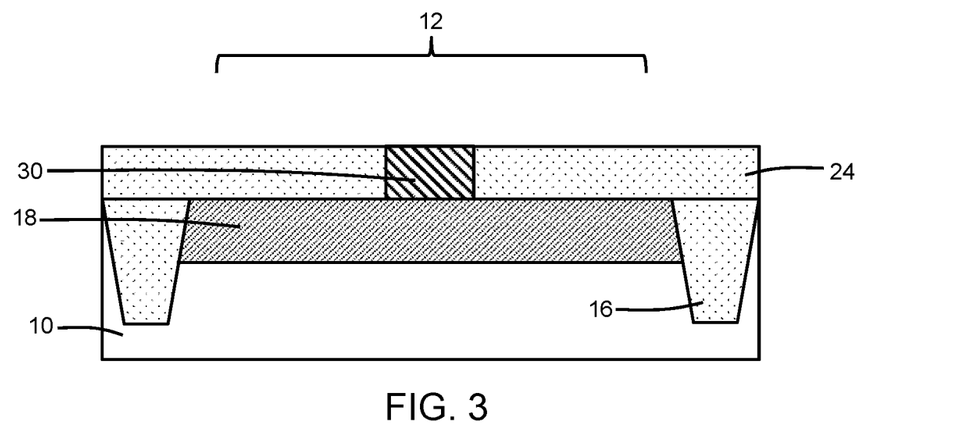
FIGS. 3 and 3A are cross-sectional views of a structure at a fabrication stage subsequent to FIGS. 2 and 2A.
Figure 3A:
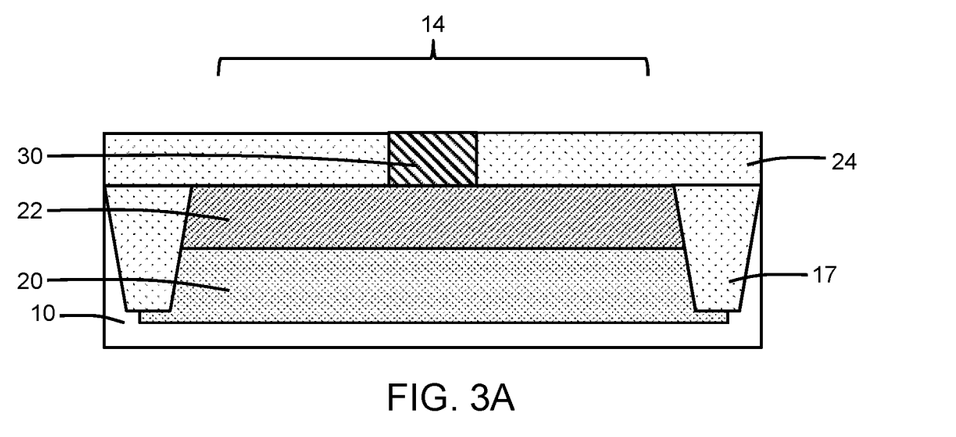

With reference to FIGS. 3, 3A in which like reference numerals refer to like features in FIGS. 2, 2A and at a subsequent fabrication stage of the processing method, a semiconductor layer 30 is formed that includes a section inside the opening 26 in the dielectric layer 24 and a section in the opening 28 inside the dielectric layer 24. The semiconductor layer 30 may include single-crystal semiconductor material that is epitaxially grown in sections from the top surface 11 of the semiconductor substrate 10 exposed inside the openings 26, 28. The semiconductor layer 30 may be formed using a selective epitaxial growth process in which the constituent semiconductor material nucleates for epitaxial growth from semiconductor surfaces but does not nucleate for epitaxial growth from insulator surfaces (e.g., the top surface of the dielectric layer 24). The section of the semiconductor layer 30 inside the opening 26 is located in the device region 12 over the doped region 18, and the section of the semiconductor layer 30 inside the opening 26 may be in direct contact with the doped region 18. The section of the semiconductor layer 30 inside the opening 28 is located in the device region 14 over the doped region 22, and the section of the semiconductor layer 30 inside the opening 28 may be in direct contact with the doped region 22. In an embodiment, the sections of the semiconductor layer 30 may be coplanar with the top surface of the dielectric layer 24 such that the respective thicknesses are equal. In an embodiment, the sections of the semiconductor layer 30 may be substantially coplanar with the top surface of the dielectric layer 24 such that the respective thicknesses are substantially equal. The respectively thicknesses may be the result of control over the epitaxial growth process and an optional post-growth planarization process. The sections of the semiconductor layer 30 may provide respective collectors for the device structures under construction in the device regions 12, 14.

In an embodiment, the semiconductor layer 30 may be composed of single-crystal silicon and may be undoped immediately following epitaxial growth. In an embodiment, the section of the semiconductor layer 30 inside opening 26 may be lightly doped (e.g., a dopant concentration less than or equal to $10^{15}$ cm$^{-3}$) by a post-growth ion implantation process that introduces a concentration of a dopant, such as an n-type dopant (e.g., arsenic or phosphorus) that provides n-type conductivity. In an alternative embodiment, the section of the semiconductor layer 30 inside opening 26 may be lightly doped by dopant outdiffusion from the doped region 18. In an embodiment, the section of the semiconductor layer 30 inside opening 28 may be lightly doped (e.g., a dopant concentration less than or equal to $10^{15}$ cm$^{-3}$) by a post-growth ion implantation process that introduces a concentration of a dopant, such as a p-type dopant (e.g., boron) that provides p-type conductivity. In an alternative embodiment, the section of the semiconductor layer 30 inside opening 28 may be lightly doped by dopant outdiffusion from the doped region 22.

Figure 4:
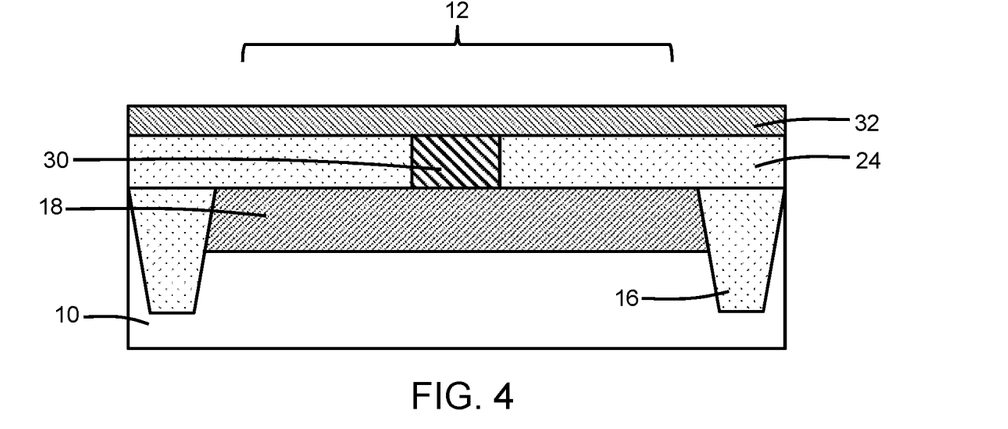
FIGS. 4 and 4A are cross-sectional views of a structure at a fabrication stage subsequent to FIGS. 3 and 3A.
Figure 4A:
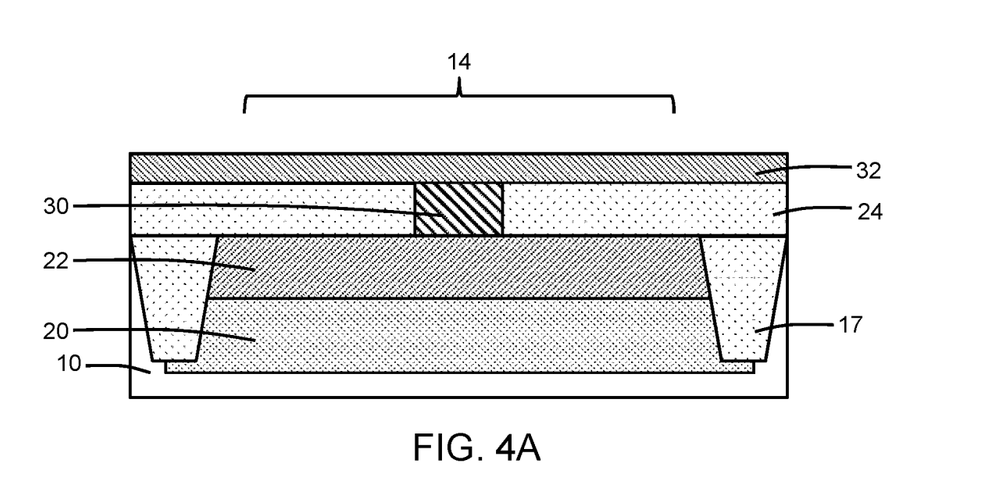

With reference to FIGS. 4, 4A in which like reference numerals refer to like features in FIGS. 3, 3A and at a subsequent fabrication stage of the processing method, a base layer 32 is formed in both device regions 12, 14 over the dielectric layer 24 and the sections of the semiconductor layer 30 inside the openings 26, 28. The section of the base layer 32 in device region 12 may be in direct contact with dielectric layer 24 and the section of the semiconductor layer 30 inside the opening 26. The section of the base layer 32 in device region 14 may be in direct contact with dielectric layer 24 and the section of the semiconductor layer 30 inside the opening 28. The base layer 32 may be formed by a non-selective epitaxial growth process and may include single-crystal semiconductor material epitaxially grown from the sections of the semiconductor layer 30 and polycrystalline semiconductor material over all or part of the dielectric layer 24. In an embodiment, all or a portion of the base layer 32 may contain silicon-germanium that includes silicon and germanium combined with a silicon content ranging from 95 atomic percent to 50 atomic percent and a germanium content ranging from 5 atomic percent to 50 atomic percent. The germanium content of the base layer 32 may have a graded profiled across its thickness in which the germanium content varies. The germanium content of the base layer 32 may have a stepped profile across its thickness with, for example, beginning and ending sub-thicknesses that lack germanium (i.e., 0 atomic percent). The base layer 32 may be in situ doped during epitaxial growth with a concentration of carbon that operates to limit diffusion of the subsequently-introduced n-type and p-type dopants. In an embodiment, the base layer 32 may include sublayers that provide a stepped composition profile across the thickness of the base layer 32. For example, the base layer 32 may include, in order of formation, a lower sublayer composed of silicon with no germanium, an intermediate sublayer composed of silicon-germanium with a uniform or graded germanium content, and an upper sublayer of silicon with no germanium.

The section of the base layer 32 in the device region 12 and the section of the base layer 32 in the device region 14 have identical germanium profiles across the thickness of the base layer 32 because these sections of the base layer 32 in the different regions 12, 14 are concurrently formed. For example, the sections of the base layer 32 may each include a sublayer with identical germanium contents arranged between upper and low sub-layers that lack germanium. The germanium profiles in the different sections of the base layer 32 are identical to the extent of process variations that may introduce minor variations in the germanium profiles.

Figure 5:
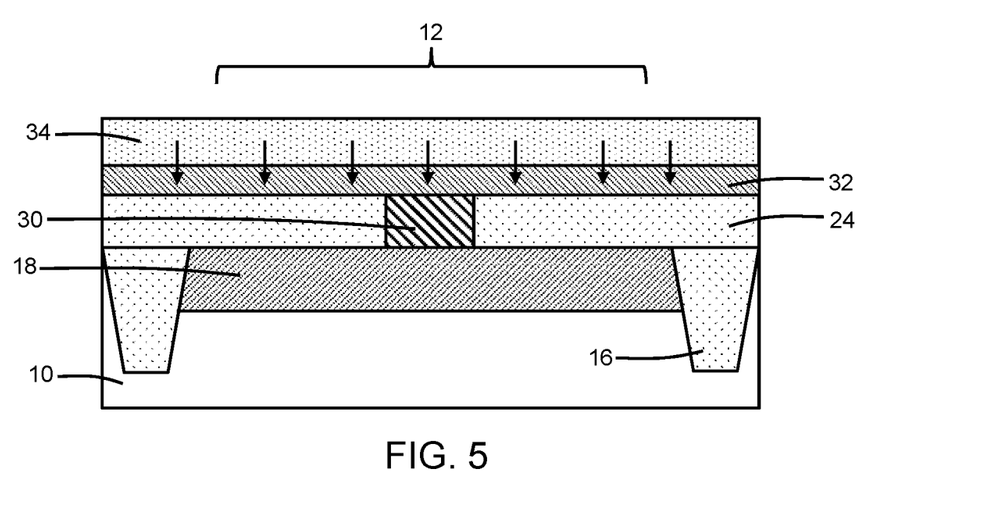
FIGS. 5 and 5A are cross-sectional views of a structure at a fabrication stage subsequent to FIGS. 4 and 4A.
Figure 5A:
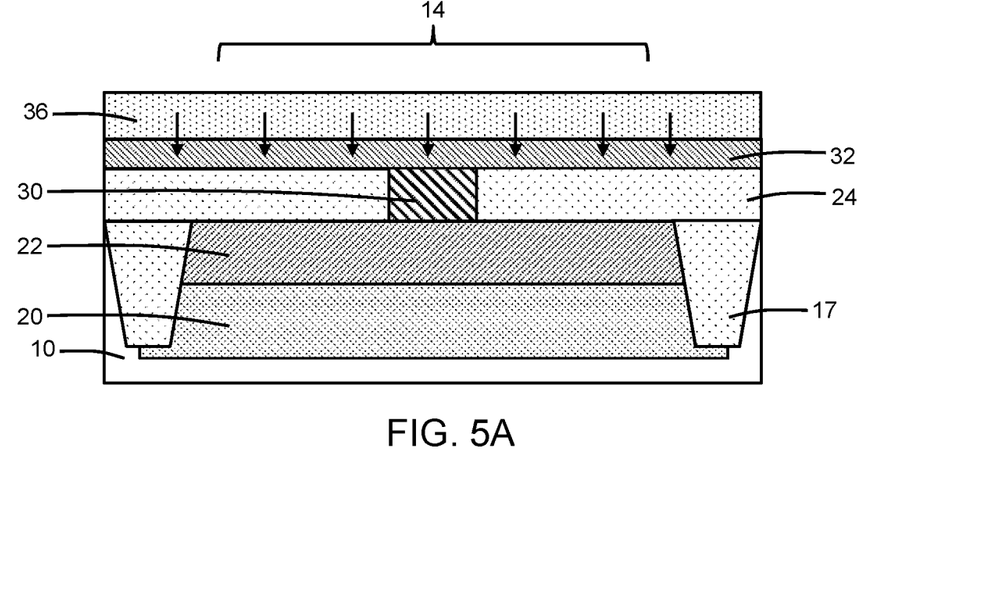

With reference to FIGS. 5, 5A in which like reference numerals refer to like features in FIGS. 4, 4A and at a subsequent fabrication stage of the processing method, a doped layer 34 is formed over the base layer 32 in the device region 12 and a doped layer 36 is formed over the base layer 32 in the device region 14. The doped layer 34 may be deposited on both device regions 12, 14 and then patterned with lithography and etching processes to remove the doped layer 34 from the device region 14. Similarly, the doped layer 36 may be deposited on both device regions 12, 14 and then patterned with lithography and etching processes to remove the doped layer 36 from the device region 12. In an embodiment, the doped layer 34 may be composed of a material that contains a concentration of a p-type dopant (e.g., boron), and the doped layer 36 may be composed of a material that contains a concentration of an n-type dopant (e.g., phosphorus). In an embodiment, the doped layer 34 may be composed of a borosilicate glass (BSG) that contains a concentration of boron. In an embodiment, the doped layer 36 may be composed of a phosphosilicate glass (PSG) that contains a concentration of phosphorus.

Following the formation of the doped layers 34, 36, an annealing process is performed to cause diffusion of the p-type dopant from the doped layer 34 into the base layer 32 in the device region 12, as indicated by the single-headed arrows in FIG. 4, and diffusion of the n-type dopant from the doped layer 36 into the base layer 32 in the device region 14, as indicated by the single-headed arrows in FIG. 4A. The annealing process be performed at a temperature in a range of 900° C. to 1200° C. for a duration sufficient to produce a given dopant concentration in the base layer 32 in the device region 12 and in the base layer 32 in the device region 14. The base layer 32 in device region 12 is doped with the p-type dopant, and the base layer 32 in device region 14 is doped with the n-type dopant. The doped layers 34, 36 may be removed by an etching process following the annealing process.

The base layer 32 occurs concurrently in both device regions 12, 14 and is produced by the same annealing process. The base layer 32 in the device region 12 is doped with the assistance of the doped layer 34. The portion of the base layer 32 in the device region 14 is doped with the assistance of the doped layer 36. The base layer 32 is doped to have different conductivity types in the different device regions 12, 14.

Figure 6:
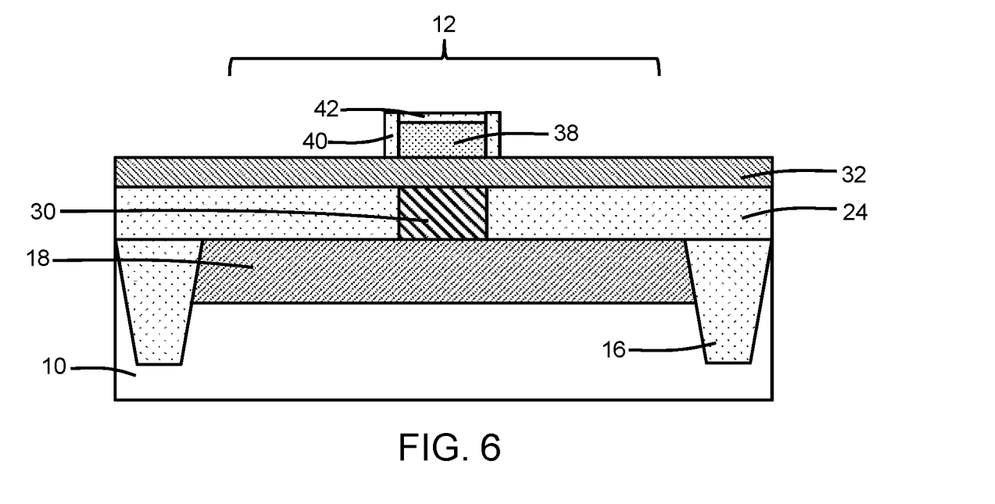
FIGS. 6 and 6A are cross-sectional views of a structure at a fabrication stage subsequent to FIGS. 5 and 5A.
Figure 6A:
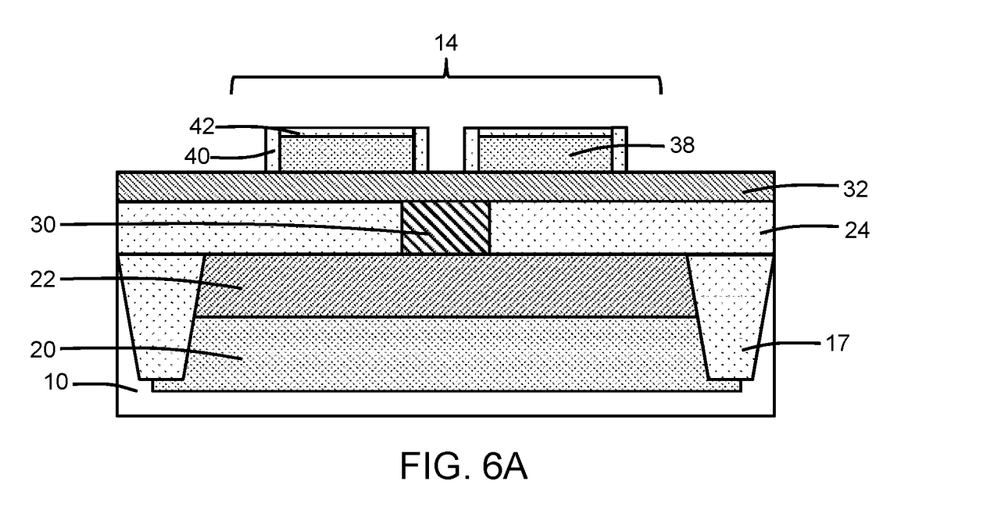

With reference to FIGS. 6, 6A in which like reference numerals refer to like features in FIGS. 5, 5A and at a subsequent fabrication stage of the processing method, a semiconductor layer 38 is formed in sections on portions of the base layer 32. The semiconductor layer 38 may be formed by depositing a blanket layer and patterning the blanket layer with lithography and etching processes. The semiconductor layer 38 may be composed of polycrystalline semiconductor material, such as polycrystalline silicon, deposited by chemical vapor deposition. In an embodiment, the semiconductor layer 38 may be in situ doped during deposition with an n-type dopant (e.g., phosphorus or arsenic) to provide n-type conductivity. In an embodiment, the semiconductor layer 38 may be heavily doped. The section of the semiconductor layer 38 in device region 12 may define an emitter of a heterojunction bipolar transistor and is located on a portion of the base layer 32. The sections of the semiconductor layer 38 in device region 14 may define a base contact of a different heterojunction bipolar transistor and is located on a portion of the base layer 32. The sections of the semiconductor layer 38 may be covered by respective hardmask caps 40 composed of a dielectric material, such as silicon nitride, and the sections of the semiconductor layer 38 may be clad by sidewall spacers 42 that are formed by depositing a conformal layer of a dielectric material, such as silicon nitride, and etching the conformal layer with an anisotropic etching process.

Figure 7:
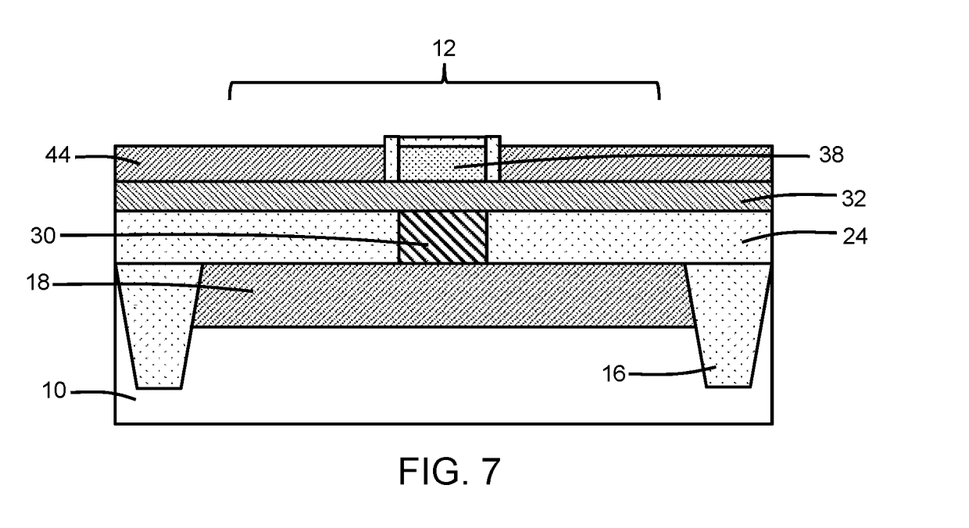
FIGS. 7 and 7A are cross-sectional views of a structure at a fabrication stage subsequent to FIGS. 6 and 6A.
Figure 7A:
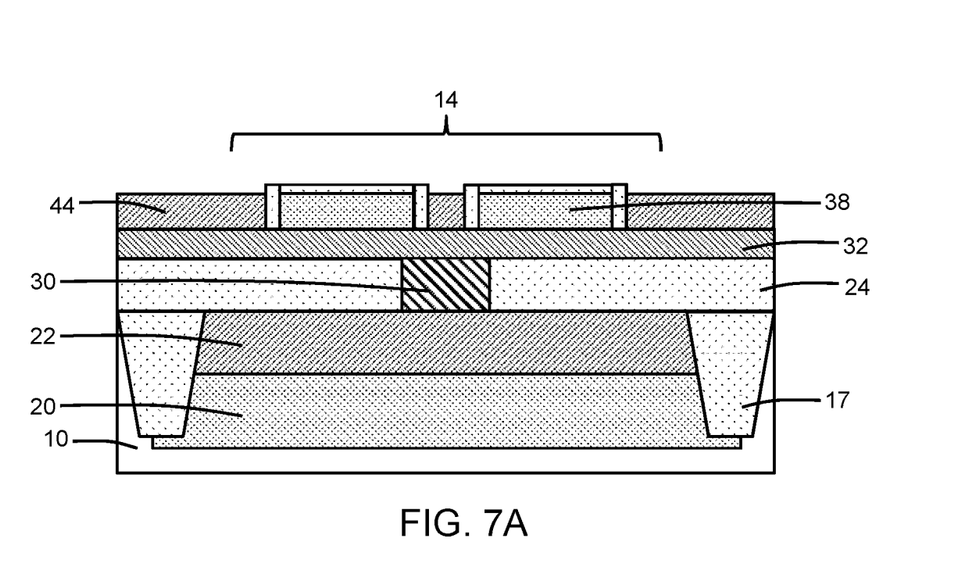

With reference to FIGS. 7, 7A in which like reference numerals refer to like features in FIGS. 6, 6A and at a subsequent fabrication stage of the processing method, a semiconductor layer 44 is formed in sections on portions of the base layer 32. The semiconductor layer 44 may be formed by an epitaxial grown process and, in an embodiment, the semiconductor layer 44 may be formed using a selective epitaxial growth process in which the constituent semiconductor material nucleates for epitaxial growth from semiconductor surfaces but does not nucleate for epitaxial growth from insulator surfaces (e.g., the hardmask caps 40 and sidewall spacers 42). The result of the selective epitaxial growth is that the sections of the semiconductor layer 44 form over locations where the semiconductor layer 44 is absent.

In an embodiment, the semiconductor layer 44 may be in situ doped during deposition with a p-type dopant (e.g., boron) to provide p-type conductivity. In an embodiment, the semiconductor layer 44 may be heavily doped. The sections of the semiconductor layer 44 in device region 12 may define a base contact of a heterojunction bipolar transistor. The section of the semiconductor layer 44 in device region 14 may define an emitter of another heterojunction bipolar transistor. The section of the semiconductor layer 44 is positioned in device region 14 on a portion of the base layer 32 and laterally between the sections of the semiconductor layer 38, and the sections of the semiconductor layer 44 are positioned in device region 12 on a portion of the base layer 32 and the section of the semiconductor layer 42 is laterally between the sections of the semiconductor layer 44.

In alternative embodiment, the order of forming the semiconductor layers 42, 44 may be reversed, in which instance the semiconductor layer 44 would be deposited and patterned before epitaxially growing the semiconductor layer 42.

Figure 8:
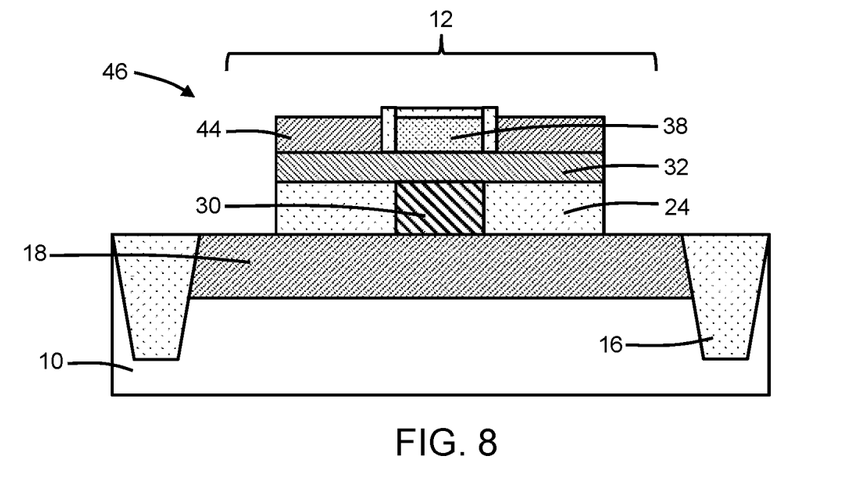
FIGS. 8 and 8A are cross-sectional views of a structure at a fabrication stage subsequent to FIGS. 7 and 7A.
Figure 8A:
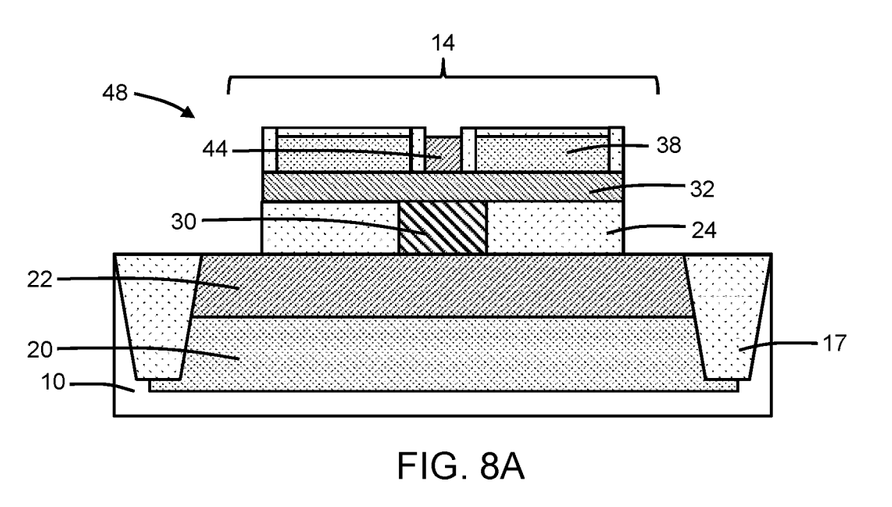

With reference to FIGS. 8, 8A in which like reference numerals refer to like features in FIGS. 7, 7A and at a subsequent fabrication stage of the processing method, a device structure 46 for a heterojunction bipolar transistor is defined in the device region 12 by patterning the semiconductor layer 44, the base layer 32, and the dielectric layer 24 with lithography and etching processes. The device structure 46 includes a sub-collector provided by the doped region 18, a collector provided by the section of the semiconductor layer 30 inside opening 26, an intrinsic base provided by the base layer 32, and an emitter provided by the section of the semiconductor layer 38 in device region 12. A device structure 48 for a heterojunction bipolar transistor is defined in the device region 14 by patterning the semiconductor layer 44, the base layer 32, and the dielectric layer 24 with lithography and etching processes. The device structure 48 includes a sub-collector provided by the doped region 22, a collector provided by the section of the semiconductor layer 30 inside opening 28, an intrinsic base provided by the base layer 32, and an emitter provided by the section of the semiconductor layer 44 in device region 14.

The device structures 46, 48 each have a vertical architecture in which a junction is arranged between the emitter and the intrinsic base and another junction is arranged between the intrinsic base and the collector. The device structures 46, 48 can be divided into an intrinsic region that includes the junctions, and an extrinsic region that is arranged laterally outside of the intrinsic region. The device structure 46 includes the sections of the semiconductor layer 44 as a base contact in the extrinsic region (i.e., an extrinsic base) that is used to contact the base layer 32 (and intrinsic base) in device region 12. The device structure 48 includes the sections of the semiconductor layer 38 as a base contact in the extrinsic region (i.e., an extrinsic base) that is used to contact the base layer 32 (and intrinsic base) in device region 14.

Middle-of-line processing and back-end-of-line processing follow, which includes formation of contacts, vias, and wiring for an interconnect structure that is coupled with the device structures 46, 48.

The device structure 46 is an NPN bipolar junction transistor in which the emitter and collector are composed of n-type semiconductor material, and the intrinsic base is composed of p-type semiconductor material. The device structure 48 is a PNP bipolar junction transistor in which the emitter and collector are composed of p-type semiconductor material and the intrinsic base is composed of n-type semiconductor material. The device structures 46, 48 are formed in different device regions 12, 14 of the same semiconductor substrate 10 and may be used to implement complementary bipolar integrated circuits.

The device structures 46, 48 share various elements. The device structures 46, 48 share a common base layer 32 that is concurrently formed in an undoped state in both device regions 12, 14. The device structures 46, 48 include different sections of the same semiconductor layer 30 that are formed undoped inside the openings 26, 28 and then subsequently doped separately to provide the opposite conductivity types. Different sections of the same semiconductor layer 38 are shared to provide the emitter of the device structure 46 and the base contact of the device structure 48. Different sections of the same semiconductor layer 44 are shared to provide the base contact of the device structure 46 and the emitter of the device structure 48.

A section of the patterned dielectric layer 24 is positioned between the section of the base layer 32 in the device region 12 and the doped region 18, which provides the sub-collector of the device structure 46. Similarly, a section of the patterned dielectric layer 24 is positioned between the section of the base layer 32 in the device region 14 and the doped region 22, which provides the sub-collector of the device structure 48. The sections of the dielectric layer 24 in the different device regions 12, 14 are effectively separate layers of dielectric material. The sections of the dielectric layer 24 may function to reduce the collector-base parasitic capacitance of the device structures 46, 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate including a first device area and a second device area;
   a first dielectric layer on the semiconductor substrate in the first device area, the first dielectric layer including an opening extending to the semiconductor substrate,
   a first heterojunction bipolar transistor including a first emitter, a first collector, and a first base layer having a first portion positioned between the first emitter and the first collector, the first collector located in the opening in the first dielectric layer; and
   a second heterojunction bipolar transistor including a second emitter, a second collector, and a second base layer having a first portion positioned between the second emitter and the second collector,
   wherein the first base layer and the second base layer each comprise silicon-germanium, the first base layer includes a first germanium profile, and the second base layer includes a second germanium profile that is identical to the first germanium profile.

2. The structure of claim 1 further comprising:
   a second dielectric layer on the semiconductor substrate in the second device area, the second dielectric layer including an opening extending to the semiconductor substrate,
   wherein the second collector is located in the opening in the second dielectric layer.

3. The structure of claim 2 wherein the second collector has a first thickness, and the second dielectric layer has a second thickness substantially equal to the first thickness.

4. The structure of claim 1 wherein the first base layer includes a second portion laterally adjacent to the first portion, the first heterojunction bipolar transistor further includes a sub-collector in the semiconductor substrate, the first collector located on the sub-collector, and the first dielectric layer is positioned between the sub-collector and the second portion of the first base layer.

5. The structure of claim 4 wherein the first heterojunction bipolar transistor includes a first base contact located on the second portion of the first base layer, and the first dielectric layer is positioned between the sub-collector and the first base contact.

6. The structure of claim 4 wherein the second portion of the first base layer is in direct contact with the first dielectric layer.

7. The structure of claim 1 wherein the first collector has a first thickness, and the first dielectric layer has a second thickness substantially equal to the first thickness.

8. The structure of claim 1 wherein the first base layer includes a second portion laterally adjacent to the first portion, the first heterojunction bipolar transistor includes a first base contact located on the second portion of the first base layer, and the first base contact and the second emitter are respective sections of a first semiconductor layer.

9. The structure of claim 8 wherein the second base layer includes a second portion laterally adjacent to the first portion, the second heterojunction bipolar transistor includes a second base contact located on the second portion of the second base layer, and the first emitter and the second base contact are respective sections of a second semiconductor layer.

10. The structure of claim 9 wherein the first semiconductor layer and the first base layer have p-type conductivity, and the second semiconductor layer and the second base layer have n-type conductivity.

11. A structure comprising:
    a first heterojunction bipolar transistor including a first emitter, a first collector, a first base contact, and a first base layer, the first base layer having a first portion positioned between the first emitter and the first collector and a second portion laterally adjacent to the first portion, and the first base contact located on the second portion of the first base layer; and
    a second heterojunction bipolar transistor including a second emitter, a second collector, a second base contact, and a second base layer having a first portion positioned between the second emitter and the second collector and a second portion laterally adjacent to the first portion, the second base contact located on the second portion of the second base layer,
    wherein the first base contact and the second emitter are respective sections of a first semiconductor layer, and the first emitter and the second base contact are respective sections of a second semiconductor layer.

12. The structure of claim 11 wherein the first semiconductor layer and the first base layer have p-type conductivity, and the second semiconductor layer and the second base layer have n-type conductivity.

13. A method comprising:
    forming a first dielectric layer on a semiconductor substrate in a first device area;
    patterning an opening in the first dielectric layer that extends to the semiconductor substrate;
    forming a first collector of a first heterojunction bipolar transistor and a second collector of a second heterojunction bipolar transistor in the semiconductor substrate, wherein the first collector is formed in the opening in the first dielectric layer;
    forming a base layer including a first section extending over the first collector and a second section extending over the second collector; and
    forming a first emitter on the first section of the base layer and a second emitter on the second section of the base layer,
    wherein the first section and the second section of the base layer each comprise silicon-germanium, the first section of the base layer includes a first germanium profile, and the second section of the base layer includes a second germanium profile that is identical to the first germanium profile.

14. The method of claim 13 further comprising:

forming a first doped layer on the first section of the base layer; and diffusing a first dopant from the first doped layer into the first section of the base layer with an annealing process.

15. The method of claim 14 further comprising:

forming a second doped layer on the second section of the base layer; and diffusing a second dopant from the second doped layer into the second section of the base layer with the annealing process.

16. The method of claim 15 further comprising:

removing the first doped layer from the first section of the base layer and the second doped layer from the second section of the base layer after the annealing process.

17. The method of claim 13 further comprising:

forming a first base contact on the first section of the base layer, wherein the first base contact and the second emitter are respective sections of a first semiconductor layer.

18. The method of claim 17 further comprising:

forming a second base contact located on the second section of the base layer, wherein the first emitter and the second base contact are respective sections of a second semiconductor layer.

19. The method of claim 18 wherein the first semiconductor layer has p-type conductivity, and the second semiconductor layer has n-type conductivity.

20. The method of claim 13 further comprising:

forming a second dielectric layer on the semiconductor substrate in a second device area; and patterning an opening in the second dielectric layer that extends to the semiconductor substrate, wherein the second collector is formed in the opening in the second dielectric layer.

\* \* \* \* \*